(12) United States Patent
Yu

(10) Patent No.: US 6,197,673 B1
(45) Date of Patent: Mar. 6, 2001

(54) METHOD OF FABRICATING PASSIVATION OF GATE ELECTRODE

(75) Inventor: Chia-Chieh Yu, Taipei Hsien (TW)

(73) Assignees: United Semiconductor Corp.; United Microelectronics Corp., both of (TW)

( * ) Notice: Subject to any disclaimer, the term of this patent is extended or adjusted under 35 U.S.C. 154(b) by 0 days.

(21) Appl. No.: 09/328,056

(22) Filed: Jun. 8, 1999

(51) Int. Cl.$^7$ .............................................. H01L 21/4763
(52) U.S. Cl. .............................................. 438/595; 438/592
(58) Field of Search .................................. 438/592, 595, 438/593, 303

(56) References Cited

U.S. PATENT DOCUMENTS

| | | | |
|---|---|---|---|
| 4,521,448 | * 6/1985 | Sasaki | 438/586 |
| 4,727,038 | * 2/1988 | Watabe et al. | 438/304 |
| 5,221,632 | * 6/1993 | Kurimoto et al. | 438/305 |
| 5,407,848 | * 4/1995 | Park et al. | 438/302 |
| 5,545,578 | * 8/1996 | Park et al. . | |
| 5,637,514 | * 6/1997 | Jeng et al. | 438/163 |
| 5,672,525 | * 9/1997 | Pan | 438/505 |
| 5,846,873 | * 12/1998 | Violette et al. | 438/585 |
| 5,972,764 | * 10/1999 | Huang et al. | 438/305 |
| 5,998,289 | * 12/1999 | Sagnes | 438/592 |
| 6,063,681 | * 5/2000 | Son | 438/303 |

* cited by examiner

*Primary Examiner*—Charles Bowers
*Assistant Examiner*—Thanh Nguyen
(74) *Attorney, Agent, or Firm*—Martine Penilla & Kim, LLP

(57) ABSTRACT

A method for fabricating a passivation layer of a gate electrode. A conductive layer, a mask layer and a patterned photoresist layer are sequentially formed on a gate oxide layer. The photoresists layer is thick enough to precisely transfer a pattern from the photoresist layer to the mask layer. The photoresist layer is stripped, and an etching step is performed to transfer the patterned of the mask layer onto the conductive layer, so as to form a gate electrode. During the etching step, a corner of the mask layer is partly truncated to form a cap layer with an arc shape corner. A conformal liner oxide layer is formed on the cap layer and a sidewall of the gate electrode. A spacer is further formed on the conformal liner oxide layer extending over a top surface of the gate electrode.

14 Claims, 3 Drawing Sheets

METHOD OF FABRICATING PASSIVATION OF GATE ELECTRODE

BACKGROUND OF THE INVENTION

1. Field of the Invention

The invention relates to a method for fabricating passivation of a gate electrode, and more particularly, to a method to avoid a bridge in the gate electrode in the subsequent process for forming a contact window.

2. Description of the Related Art

In the conventional method for forming a gate electrode, a photoresist layer is used to transfer a pattern to an underlying nitride layer, tungsten silicide layer and a polysilicon layer. The photoresist layer is then removed. As long as the photoresist layer is sufficiently thick, the precision for the pattern transferring step can be retained. A cap layer is formed on the gate electrode, followed by forming a conformal liner oxide layer on the gate electrode. A spacer is formed on sidewalls of the gate electrode and the cap layer. While forming an opening within an oxide layer formed over the gate electrode, since the materials of the liner oxide layer and the oxide layer are the same, the liner oxide layer between the spacer and the gate electrode is to be removed consequently. When the opening is filled by a conductive material, a bridge between the conductive material and the gate electrode is caused to result a device failure. The yield of product is thus seriously affected.

SUMMARY OF THE INVENTION

The invention provides a method for fabricating passivation of a gate electrode. A gate oxide layer, a conductive layer and a mask layer are formed. A patterned photoresist layer is formed on the mask layer. The photoresist layer is sufficient thick to precisely transfer a pattern to the mask layer. After patterning the mask layer, the photoresist layer is removed. Using anisotropic etching process, the patterned of the mask layer is transferred to the conductive layer to form a gate electrode. During the anisotropic etching process, a corner of the mask layer is partly truncated to form a cap layer with an arc shape corner. A conformal liner oxide layer is formed on a surface of the cap layer and a sidewall of the gate electrode. A spacer is formed on the liner oxide layer over sidewalls of the gate electrode and the cap layer. Due to arc shape corner of the cap layer, the spacer is formed to cover a part of the top surface of the cap layer, that is, from a cross sectional view, a distance between the topmost portion of spacer on two opposite sidewalls is smaller than the width of the gate electrode. The liner oxide layer between the spacer and the gate electrode is thus protected from being etched.

In another embodiment of the invention, in case the photoresist layer is not thick enough to obtain a precision transferred patterned as required, a distortion of the pattern is resulted. The distorted photoresist layer together with the patterned mask is served as a mask to pattern the underlying conductive layer to form a gate electrode. As a result, similar consequence is caused, that is, a cap layer with an arc shape corner is formed to cause a spacer extending over a top surface of the gate electrode, so as to protect the liner oxide layer formed between the spacer and the gate electrode from being etched.

Thus, in the invention, the mask layer has an arc shape corner to cause a spacer formed subsequently exceeding over a top surface of the gate electrode, so that a liner oxide layer formed between the spacer and the gate electrode is protected from being removed. The completeness of the gate electrode is thus retained. Since the liner oxide layer between the gate electrode and the spacer is protected from being removed, a bridge or even a short circuit between the gate electrode and a conductive plug formed subsequently is prevented from happening.

It is understood that both the foregoing general description and the following detailed description are exemplary and explanatory only and are not restrictive of the invention, as claimed.

DESCRIPTION OF THE PREFERRED EMBODIMENTS

FIG. 1A to FIG. 1E show cross sectional views of fabricating process for forming a passivation layer of a gate electrode according to an embodiment of the invention.

Figure 1A:
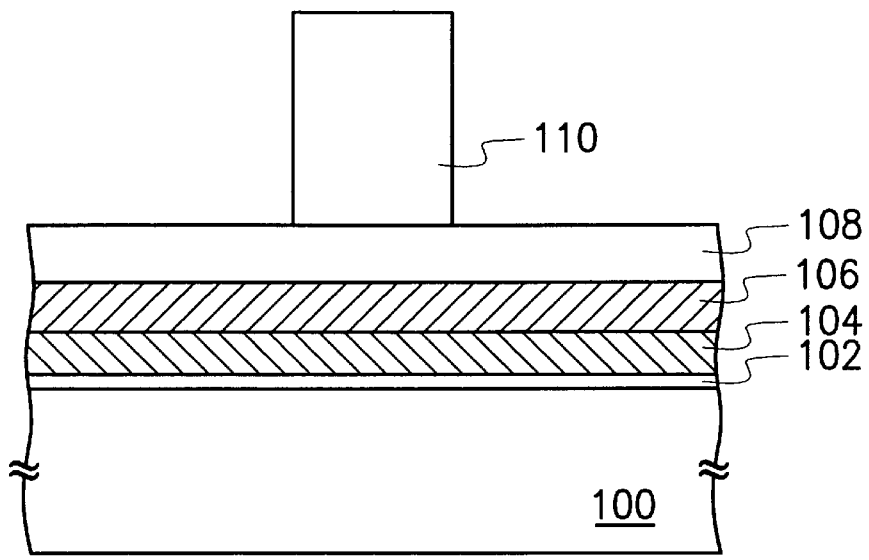
FIG. 1A to FIG. 1E show cross sectional views of fabricating process for forming a passivation layer of a gate electrode according to an embodiment of the invention; and FIG. 2A to FIG. 2C shows cross sectional views of fabrication process for forming passivation of the gate electrode in another embodiment of the invention.

FIG. 1A, a substrate 100, for example, a silicon substrate having an isolation structure formed to define an active region thereon is provided. A gate oxide layer 102 is formed on the substrate 100, for example, by a thermal oxidation method. A polysilicon layer 104, a silicide layer 106 and a mask layer 108 are formed on the gate oxide layer 102 in sequence. The material for forming the mask layer 108 includes, for example, silicon nitride, while the material used for forming the silicide layer 106 includes, for example, tungsten silicide. The polysilicon layer 104 and the silicide layer 106 are to serve as a conductive layer of a gate electrode. A patterned photoresist layer 110 is formed on the mask layer 108. To obtain a precise transferred pattern from the photoresist layer 110 to the mask layer 108, the photoresist layer 110 has to be sufficiently thick. That is, in the fabrication process with a linewidth of about 0.35 micron, the thickness of the photoresist layer 110 has to be no less than about 9000 angstroms to compensate the loss during an etching step, so as to avoid the distortion of the pattern of the photoresist layer 110.

Figure 1B:
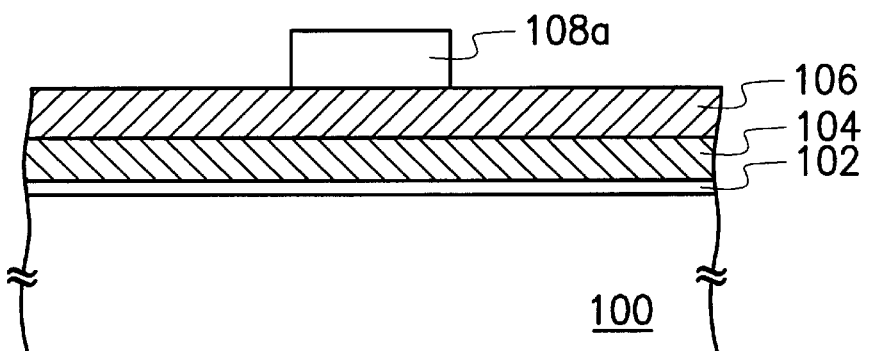

In FIG. 1B, after transferring the pattern from the photoresist layer 110 to the mask layer 108, the patterned mask layer is denoted as 108a as shown in FIG. 1B. The method of transferring the pattern comprising an anisotropic dry etching step. The photoresist layer 110 is then stripped.

Figure 1C:
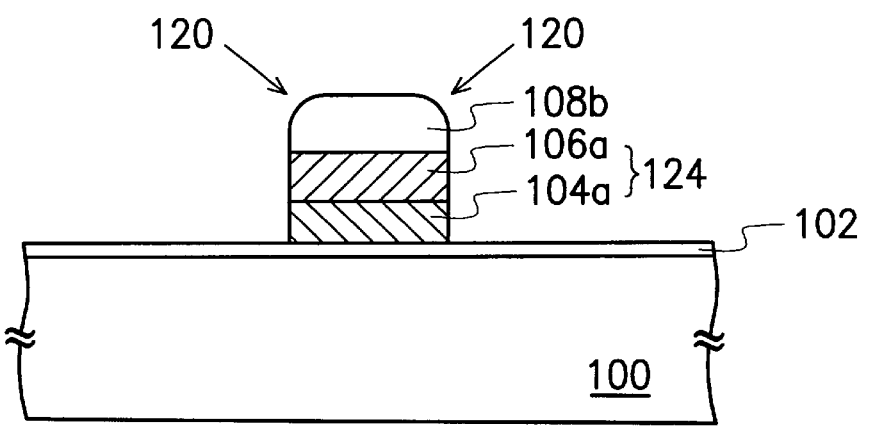

In FIG. 1C, using the patterned mask layer 108a as a mask, the silicide layer 106 and the polysilicon layer 104 are etched into silicide layer 106a and polysilicon layer 104a. The etching step includes, for example, anisotropic dry etching step. During the etching step, a sharp corner of the mask layer 108a is truncated into an arc shape corner 120. In this embodiment, the mask layer 108a having an arc shape corner is then referred to a cap layer 108b. The patterned silicide layer 106a and the patterned polysilicon layer 104a thus construct a gate electrode 124.

Figure 1D:
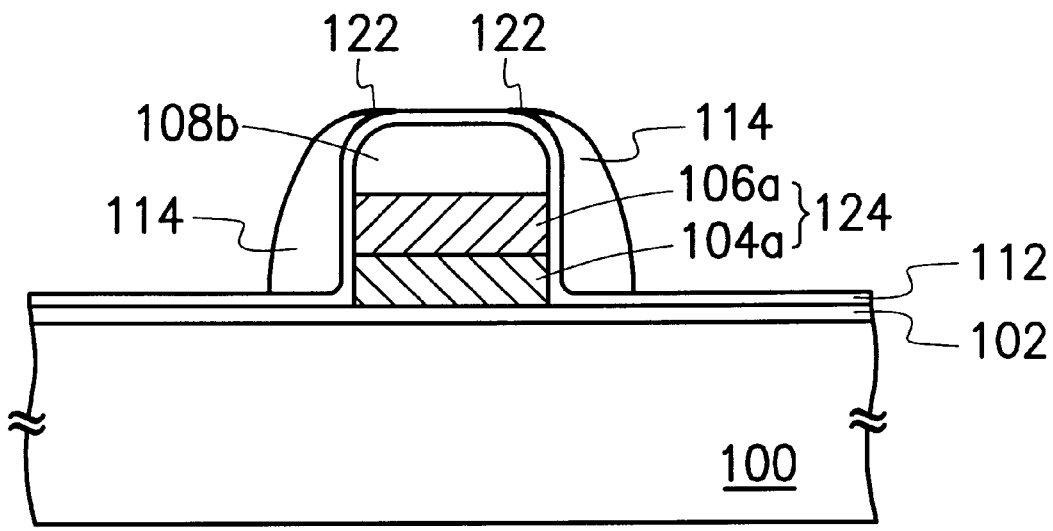

In FIG. 1D, a conformal liner oxide layer 112 is formed along a surface profile of the substrate 100. That is, the conformal liner oxide layer 112 is formed to cover a sidewall of the gate electrode 124 and a surface of the cap layer 108b. A spacer 114 is further formed on the liner oxide layer 112 over the sidewall of the gate electrode 124 and a portion of the surface of the cap layer. The material to form the space 114 includes, for example, silicon nitride. The method for forming the spacer 114 comprises forming a silicon nitride layer over the substrate 100, followed by being etched by an anisotropic dry etching step. As a consequence, the liner oxide layer 112 over the sidewall of the gate electrode 124, as well as, the arc shape corner 120 of the cap layer 108b are covered by the spacer.

Due to the geometry of the arc shape corner 120, the spacer 114 formed on the liner oxide layer 112 has a portion exceeding over a top surface of the gate electrode 124. That is, from a cross sectional view, a distance between two topmost portions of the spacer 114 on two opposite sidewalls of the gate electrode 124 is shorter than a width of the gate electrode 124.

Figure 1E:
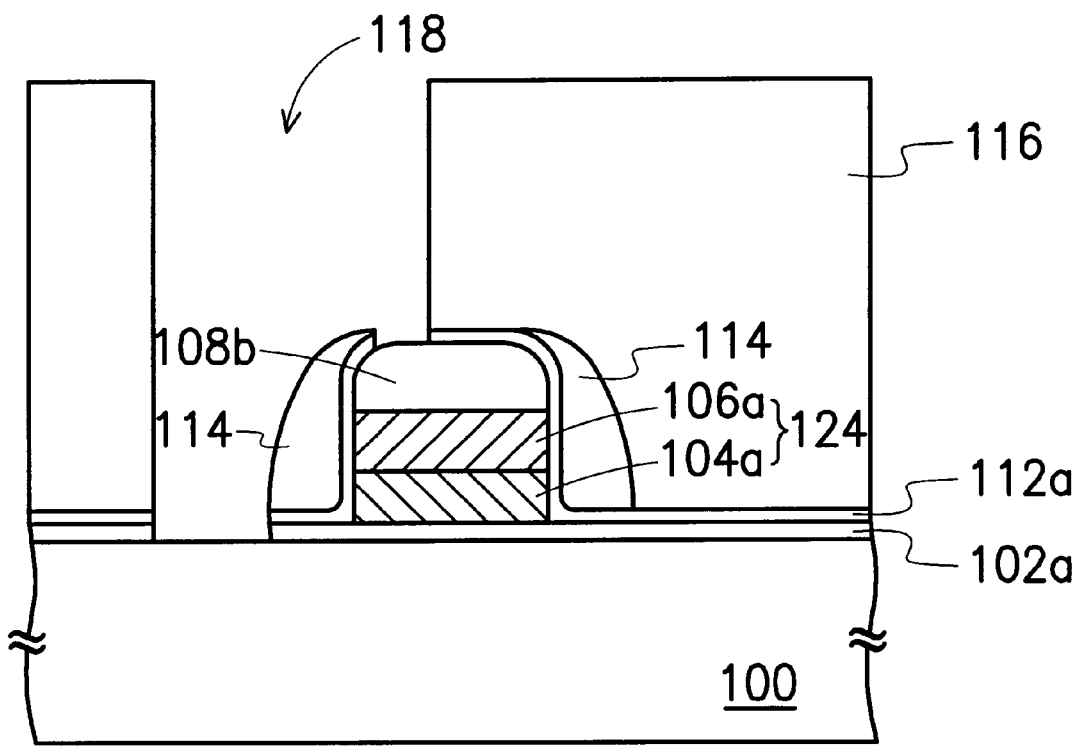

In FIG. 1E, an insulation layer 116, for example, an oxide layer, is formed to over the substrate 100. An opening 118 is formed to expose a part of the substrate 100. As shown in the figure, since the materials of the insulation layer 116 and the liner oxide layer 112 are similar, a part of the liner oxide layer 112 uncovered by the spacer 114 is to be removed as well. However, since the spacer 114 extends over the top surface of the gate electrode 124, the liner oxide layer 112 formed between the spacer 114 and the gate electrode 124 is protected by the spacer 114 without being removed. Therefore, in a subsequent process for filling the opening 118 with a conductive material, a bridge occurring in the conventional method is avoided.

The formation of source/drain regions are conventional technique to those skilled in the art, so that a detailed description is not given here.

Figure 2A:
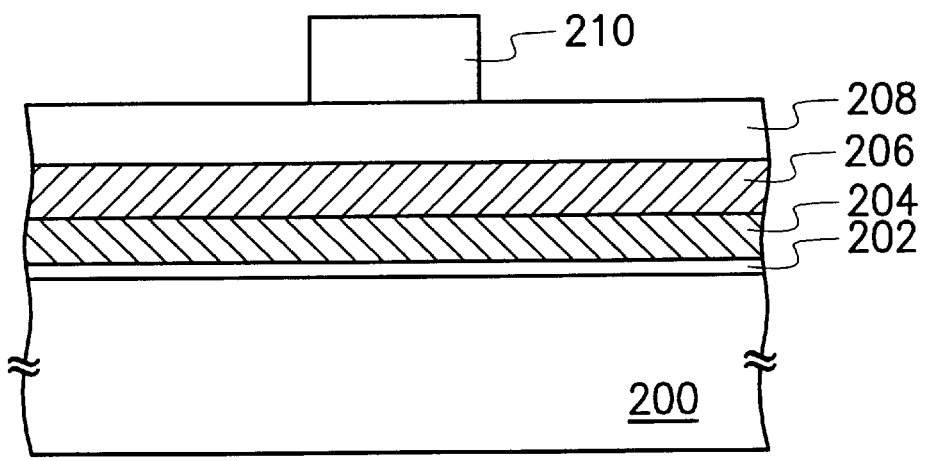
Figure 2B:
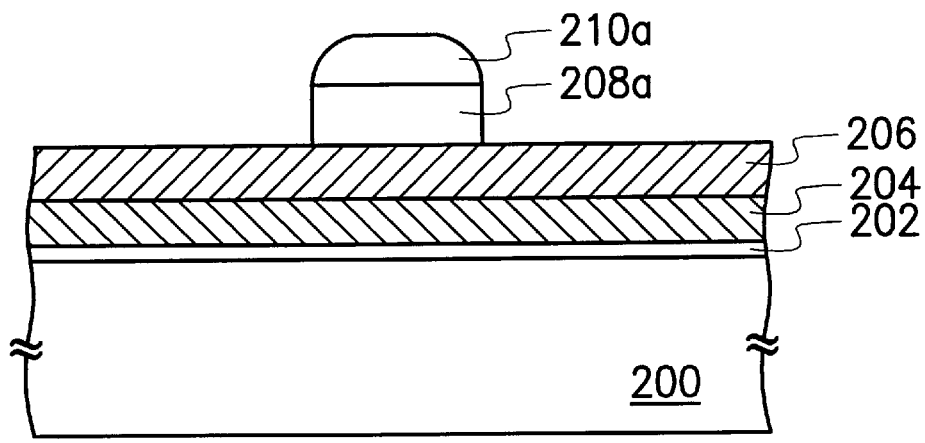
Figure 2C:
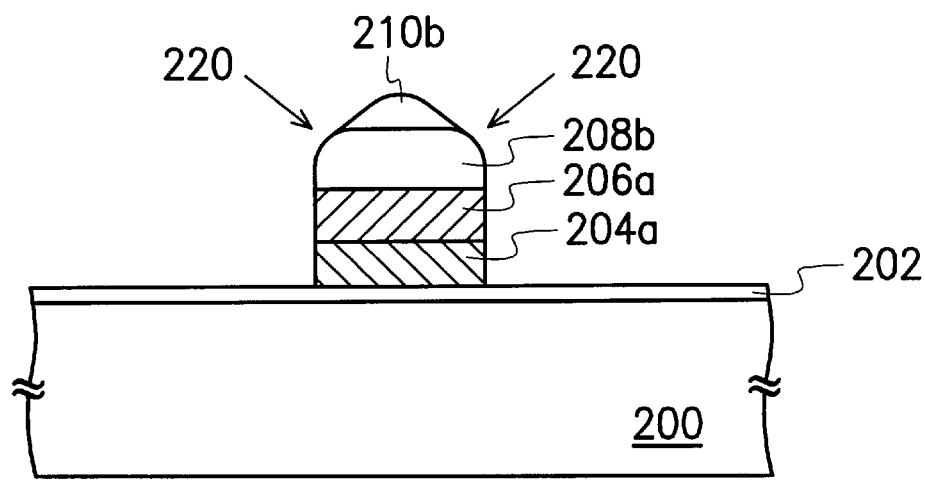

FIG. 2A and FIG. 2C shows cross sectional views of fabrication process for forming passivation of the gate electrode in another embodiment of the invention.

In FIG. 2A, a substrate 200, for example, a silicon substrate having an isolation structure formed to define an active region thereon is provided. A gate oxide layer 202 is formed on the substrate 200, for example, by a thermal oxidation method. A polysilicon layer 204, a silicide layer 206 and a mask layer 208 are formed on the gate oxide layer 202 in sequence. The material for forming the mask layer 208 includes, for example, silicon nitride, while the material used for forming the silicide layer 206 includes, for example, tungsten silicide. The polysilicon layer 204 and the silicide layer 206 are to serve as a conductive layer of a gate electrode. A patterned photoresist layer 210 is formed on the mask layer 208. To obtain a precise transferred pattern from the photoresist layer 210 to the mask layer 208, the photoresist layer 110 has to be sufficiently thick. That is, in the fabrication process with a linewidth of about 0.35 micron, the thickness of the photoresist layer 210 is ranged from about 3000–6000 angstroms to compensate the loss during an etching step, so as to avoid the distortion of the pattern of the photoresist layer 210.

In FIG. 2B, the pattern of the photoresist layer 210 is transferred to the mask layer 208. In this embodiment, the photoresist layer 210 is not thickness enough to compensate the etching loss, therefore, a distortion of the photoresist pattern occurs while etching the mask layer 208. The resultant photoresist layer and mask layer are denoted as 210a and 208a. As shown in the figure, the photoresist layer has an arc shape corner.

In FIG. 2C, using both the distorted photoresist layer 210a and the mask layer 208a as a mask, the silicide layer 206 and the polysilicon layer 204 are etched to result in the patterned polysilicon layer 204a, the patterned silicide layer 206a, the distorted mask layer 208b and the further distorted photoresist layer 210b. As the mask layer 208a is further etched using the distorted photoresist layer 210a (shown in FIG. 2B) as a mask after being etched, the arc shape corner on the photoresist layer 210a is thus transferred onto the mask layer 208b. The photoresist layer 210b is then removed. An the following process is similar to those describe in the previous embodiment.

The invention thus has at least the following advantages:

(1) The mask layer has an arc shape corner to cause a spacer formed subsequently exceeding over a top surface of the gate electrode, so that a liner oxide layer formed between the spacer and the gate electrode is protected from being removed. The completeness of the gate electrode is thus retained.

(2) Since the liner oxide layer between the gate electrode and the spacer is protected from being removed, a bridge or even a short circuit between the gate electrode and a conductive plug formed subsequently is prevented from happening.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating passivation of a gate electrode, comprising:

providing a substrate covered by a gate oxide layer;

forming a conductive layer on the gate oxide layer and a mask layer on the conductive layer;

forming a photoresist layer with a pattern on the conductive layer;

transferring the pattern from the photoresist layer to the mask layer, wherein the photoresist layer has a sufficient thickness to transfer the pattern onto the mask layer without causing distortion;

removing the photoresist layer;

transferring the pattern from the mask layer to the conductive layer, and truncating a sharp corner of the mask layer to result in a cap layer with an arc shape corner on the conductive layer;

forming a conformal liner oxide layer along a surface of the cap layer and on a sidewall of the conductive layer; and forming a spacer on the liner oxide layer over the sidewall of the conductive layer and extending over a top surface of the gate to cover the liner oxide layer between the spacer and the conductive layer.

2. The method according to claim 1, comprising further a step of forming an insulation layer over the substrate after the formation of the spacer.

3. The method according to claim 2, comprising further a step of forming an opening in the insulation layer to expose a part of the substrate, wherein a part of the liner oxide layer on the mask layer is also removed.

4. The method according to claim 3, wherein the opening is filled with a conductive material.

5. The method according to claim 1, wherein the mask layer comprises a silicon nitride layer.

6. The method according to claim 1, wherein the thickness of the photoresist layer is about 9000 angstroms in a fabrication process with a linewidth of about 0.35 micron.

7. The method according to claim 1, wherein the step of transferring the pattern to the conductive layer and truncating the corner of the mask layer is performed using an anisotropic dry etching step.

8. The method according to claim 1, wherein the polysilicon layer is further covered by a silicide layer.

9. A method for fabricating passivation on a gate electrode, comprising:

providing a substrate covered by a gate oxide layer;

forming a gate electrode layer and a mask layer;

forming a patterned photoresist layer;

patterning the mask layer into a cap layer with the photoresist layer as a mask, while the photoresist layer is distorted;

patterning the electrode layer into a gate electrode with both the cap layer and the distorted photoresist layer as a mask;

removing the photoresist layer;

forming a conformal liner oxide layer on a surface of the cap layer and a sidewall of the gate electrode; and forming a spacer on the conformal liner oxide layer over the sidewall of the gate electrode and a part of the cap layer including a part of a top surface thereof and an arc shape corner.

10. The method according to claim 10, comprising further the steps of:

forming an insulation layer to cover the gate oxide layer, the liner oxide and the cap layer after forming the spacer; and etching the insulation layer to form an opening to expose a part of the substrate, the spacer and the liner oxide layer, while the exposed liner oxide layer is removed consequently.

11. The method according to claim 10, comprising further filling the opening with a conductive material.

12. The method according to claim 9, wherein the photoresist layer has a thickness ranged about 3000–6000 angstroms.

13. The method according to claim 9, wherein the cap layer has an arc shape corner.

14. The method according to claim 9, wherein from a cross sectional view, the spacer has two topmost portions at two sides of the gate electrode separated with each other by a distance shorter than a width of the gate electrode.

* * * * *